(12) United States Patent
Gurary et al.

(10) Patent No.: US 9,053,935 B2
(45) Date of Patent: Jun. 9, 2015

(54) CHEMICAL VAPOR DEPOSITION WITH ELEVATED TEMPERATURE GAS INJECTION

(71) Applicant: Veeco Instruments Inc., Plainview, NY (US)

(72) Inventors: Alexander I. Gurary, Bridgewater, NJ (US); Mikhail Belousov, Plainsboro, NJ (US); Bojan Mitrovic, Somerset, NJ (US)

(73) Assignee: Veeco Instruments Inc., Plainview, NY (US)

( * ) Notice: Subject to any disclaimer, the term of this patent is extended or adjusted under 35 U.S.C. 154(b) by 0 days.

(21) Appl. No.: 14/533,650

(22) Filed: Nov. 5, 2014

(65) Prior Publication Data

US 2015/0056790 A1     Feb. 26, 2015

Related U.S. Application Data

(60) Division of application No. 13/128,163, filed as application No. PCT/US2009/063532 on Nov. 6, 2009, now Pat. No. 8,937,000, which is a continuation-in-part of application No. 12/291,350, filed on Nov. 6, 2008, now Pat. No. 8,895,107.

(51) Int. Cl.
| | |
|---|---|
| *H01L 21/20* | (2006.01) |
| *H01L 21/36* | (2006.01) |
| *H01L 21/00* | (2006.01) |
| *H01L 21/26* | (2006.01) |

(Continued)

(52) U.S. Cl.
CPC ...... *H01L 21/02538* (2013.01); *H01L 21/0262* (2013.01)

(58) Field of Classification Search
None
See application file for complete search history.

(56) References Cited

U.S. PATENT DOCUMENTS

| 5,320,680 A | 6/1994 | Learn et al. |
| 5,336,324 A | 8/1994 | Stall et al. |

(Continued)

FOREIGN PATENT DOCUMENTS

| JP | 03077384 | 4/1991 |
| JP | 04284623 | 10/1992 |

(Continued)

OTHER PUBLICATIONS

International Search Report and Written Opinion, PCT/US2009/063532, dated May 27, 2010.

(Continued)

*Primary Examiner* — Calvin Choi
(74) *Attorney, Agent, or Firm* — Lerner, David, Littenberg, Krumholz & Mentlik, LLP

(57) ABSTRACT

A chemical vapor deposition reactor and method. Reactive gases, such as gases including a Group III metal source and a Group V metal source, are introduced into the chamber (10) of a rotating-disc reactor and directed downwardly onto a wafer carrier (32) and substrates (40) which are maintained at an elevated substrate temperature, typically above about 400° C. and normally about 700-1100° C. to deposit a compound such as a III-V semiconductor. The gases are introduced into the reactor at an inlet temperature desirably above about 75° C. and most preferably about 100°-350° C. The walls of the reactor may be at a temperature close to the inlet temperature. Use of an elevated inlet temperature allows the use of a lower rate of rotation of the wafer carrier, a higher operating pressure, lower flow rate, or some combination of these.

20 Claims, 4 Drawing Sheets

(51) Int. Cl.
*H01L 21/42* (2006.01)
*H01L 21/302* (2006.01)
*H01L 21/461* (2006.01)
*H01L 21/31* (2006.01)
*H01L 21/469* (2006.01)
*H01L 21/02* (2006.01)
*H01L 21/205* (2006.01)

(56) References Cited

U.S. PATENT DOCUMENTS

| | | |
|---|---|---|
| 5,370,739 A | 12/1994 | Foster et al. |
| 5,950,925 A | 9/1999 | Fukunaga et al. |
| 5,975,912 A | 11/1999 | Hillman et al. |
| 6,066,196 A | 5/2000 | Kaloyeros et al. |
| 6,218,280 B1 | 4/2001 | Kryliouk et al. |
| 6,274,496 B1 | 8/2001 | Leusink et al. |
| 6,289,842 B1 | 9/2001 | Tompa |
| 6,331,212 B1 | 12/2001 | Mezey, Sr. |
| 6,451,692 B1 | 9/2002 | Derderian et al. |
| 6,902,623 B2 | 6/2005 | Gurary et al. |
| 7,135,073 B2 | 11/2006 | Heuken et al. |
| 2002/0185068 A1 | 12/2002 | Gurary et al. |
| 2004/0050325 A1 | 3/2004 | Samoilov et al. |
| 2004/0231599 A1 | 11/2004 | Schwambera et al. |
| 2005/0166835 A1 | 8/2005 | Koukitsu et al. |
| 2006/0021574 A1 | 2/2006 | Armour et al. |
| 2006/0157696 A1 | 7/2006 | Katoda |
| 2007/0134419 A1 | 6/2007 | Mitrovic et al. |
| 2008/0003763 A1 | 1/2008 | Raaijmakers et al. |
| 2008/0173239 A1 | 7/2008 | Makarov et al. |
| 2008/0173242 A1 | 7/2008 | Makarov et al. |
| 2008/0173735 A1 | 7/2008 | Mitrovic et al. |
| 2009/0098276 A1 | 4/2009 | Burrows et al. |
| 2010/0006023 A1 | 1/2010 | Bour et al. |

FOREIGN PATENT DOCUMENTS

| | | |
|---|---|---|
| JP | 2005226257 | 9/1993 |
| JP | 2004031874 A | 1/2004 |

OTHER PUBLICATIONS

Official Action issued Nov. 15, 2012, in Taiwanese Patent Application No. 098137821.
Taiwanese Office Action for Application No. 098137821 dated Jul. 17, 2013.
Extended European Search Report for Application EP 09825467.5 dated Jun. 18, 2013.
Japanese Office Action for Application No. 2004-033809 dated Feb. 4, 2014.

CHEMICAL VAPOR DEPOSITION WITH ELEVATED TEMPERATURE GAS INJECTION

CROSS-REFERENCE TO RELATED APPLICATIONS

This application is a divisional of U.S. patent application Ser. No. 13/128,163, filed on Jun. 17, 2011, which is a national phase entry under 35 U.S.C. §371 of International Application No. PCT/US2009/063532, filed on Nov. 6, 2009, published in English, which is a continuation-in-part of U.S. patent application Ser. No. 12/291,350, filed on Nov. 6, 2008, the disclosure of which is incorporated herein by reference.

FIELD OF THE INVENTION

The present invention relates generally to chemical vapor deposition methods and apparatus.

BACKGROUND OF THE INVENTION

Chemical vapor deposition involves directing one or more gases containing chemical species onto a surface of a substrate so that the reactive species react and form a deposit on the surface. For example, compound semiconductors can be formed by epitaxial growth of a semiconductor material on a substrate. The substrate typically is a crystalline material in the form of a disc, commonly referred to as a "wafer." Compound semiconductors such as III-V semiconductors commonly are formed by growing layers of the compound semiconductor on a wafer using a source of a Group III metal and a source of a group V element. In one process, sometimes referred to as a "chloride" process, the Group III metal is provided as a volatile halide of the metal, most commonly a chlorides such as $GaCl_2$ whereas the Group V element is provided as a hydride of the Group V element. In another process, commonly referred to as metal organic chemical vapor deposition or "MOCVD" the chemical species include one or more metal organic compounds such as alkyls of the Group III metals gallium, indium, and aluminum, and also include a source of a Group V element such as one or more of the hydrides of one or more of the Group V elements, such as $NH_3$, $AsH_3$, $PH_3$ and hydrides of antimony. In these processes, the gases are reacted with one another at the surface of a wafer, such as a wafer of sapphire, Si, GaAs, InP, InAs or GaP, to form a III-V compound of the general formula $In_x Ga_y Al_z N_A As_B P_C Sb_D$ where X+Y+Z=approximately 1, and A+B+C+D=approximately 1, and each of X, Y, Z, A, B, C and D can be between 0 and 1. In some instances, bismuth may be used in place of some or all of the other Group III metals.

In either process, the wafer is maintained at an elevated temperature within a reaction chamber. The reactive gases, typically in admixture with inert carrier gases, are directed into the reaction chamber. Typically, the gases are at a relatively low temperature, as for example, about 50-60° C. or below, when they are introduced into the reaction chamber. As the gases reach the hot wafer, their temperature, and hence their available energy for reaction, increases.

One form of apparatus which has been widely employed in chemical vapor deposition includes a disc-like wafer carrier mounted within the reaction chamber for rotation about a vertical axis. The wafers are held in the carrier so that surfaces of the wafers face upwardly within the chamber. While the carrier is rotated about the axis, the reaction gases are introduced into the chamber from a flow inlet element above the carrier. The flowing gases pass downwardly toward the carrier and wafers, desirably in a laminar plug flow. As the gases approach the rotating carrier, viscous drag impels them into rotation around the axis, so that in a boundary region near the surface of the carrier, the gases flow around the axis and outwardly toward the periphery of the carrier. As the gases flow over the outer edge of the carrier, they flow downwardly toward exhaust ports disposed below the carrier. Most commonly, this process is performed with a succession of different gas compositions and, in some cases, different wafer temperatures, to deposit plural layers of semiconductor having differing compositions as required to form a desired semiconductor device. Merely by way of example, in formation of light emitting diodes ("LEDs") and diode lasers, a multiple quantum well ("MQW") structure can be formed by depositing layers of III-V semiconductor with different proportions of Ga and In. Each layer may be on the order of tens of Angstroms thick, i.e., a few atomic layers.

Apparatus of this type can provide a stable and orderly flow of reactive gases over the surface of the carrier and over the surface of the wafer, so that all of the wafers on the carrier, and all regions of each wafer, are exposed to substantially uniform conditions. This, in turn promotes uniform deposition of materials on the wafers. Such uniformity is important because even minor differences in the composition and thickness of the layers of material deposited on a wafer can influence the properties of the resulting devices.

The wafer temperature normally is set to optimize the desired deposition reaction; it is commonly above 400° C. and most typically about 700°-1100° C. It is generally desirable to operate equipment of this type at the highest chamber pressure, lowest rotation speed and lowest gas flow rate which can provide acceptable conditions. Pressures on the order of 10 to 1000 Torr, and most commonly about 100 to about 750 Torr, are commonly used. Lower flow rates are desirable to minimize waste of the expensive, high-purity reactants and also minimize the need for waste gas treatment. Lower rotation speeds minimize effects such as centrifugal forces and vibration on the wafers. Moreover, there is normally a direct relationship between rotation speed and flow rate; under given pressure and wafer temperature conditions, the flow rate required to maintain stable, orderly flow and uniform reaction conditions increases with rotation rate.

Prior to the present invention, however, the operating conditions which could be used were significantly constrained. It would be desirable to permit lower rotation speeds and gas flows, higher operating pressures, or both, while still preserving the stable flow pattern.

BRIEF SUMMARY OF THE INVENTION

One aspect of the invention provide methods of chemical vapor deposition. A method according to this aspect of the invention desirably includes the step of supporting one or more substrates on a carrier within a reaction chamber so that surfaces of the substrates face upwardly within the chamber, while rotating the carrier about a vertical axis and maintaining the substrates at a substrate temperature of 400° C. or higher, typically 500° C. or higher. The method desirably also includes the step of directing gases, most preferably gases which include a Group III metal source and a Group V compound, into the chamber from an inlet element disposed above the substrates. The gases flow downward toward the substrates and outwardly away from the axis over the surfaces of the substrates and react to form a deposit such as a III-V semiconductor on the substrates. The gases most preferably are at an inlet temperature above about 75° C., as, for example, about 75° C. to about 350° C., and more preferably above about 100° C. such as about 100° C. to about 250° C.

when introduced into the chamber. Preferably, the walls of the chamber are maintained at a temperature within about 50° C. of the inlet temperature.

Preferred methods according to this aspect of the invention can provide significant improvements in operating range. In particular, the preferred methods according to this aspect of the invention can operate at lower rotational speeds, lower gas flow rates, and higher pressures than similar processes using lower gas inlet temperatures.

A further aspect of the present invention provides a chemical vapor deposition reactor. The reactor according to this aspect of the invention desirably is a rotating-disc reactor, and desirably includes a flow inlet temperature control mechanism arranged to maintain the flow inlet element of the reactor at an inlet temperature as discussed above in connection with the method. Most preferably, the reactor also includes a chamber temperature control mechanism arranged to maintain the walls of the chamber at a wall temperature as discussed above.

Still further aspects of the invention provide chemical vapor deposition apparatus and processes which employ a gas inlet temperature less than the substrate temperature, and a temperature difference ΔT of at least about 200° C. between these temperatures. Such apparatus and processes are referred to in this disclosure as "cold wall" apparatus and processes. Typically, ΔT in cold wall apparatus and processes is more than 200° C., as, for example, about 400° C. or more or about 500° C. or more. According to these aspects of the present invention, the gas inlet temperature is above about 75° C., and desirably above about 100° C. Desirably, the walls of the reactor are maintained at a wall temperature which is also above about 75° C. and desirably above about 100° C. The cold wall apparatus and processes are commonly used in chemical vapor deposition systems in which one or more of the reactive gasses includes an organic or metalorganic compound.

DETAILED DESCRIPTION

Figure 1:
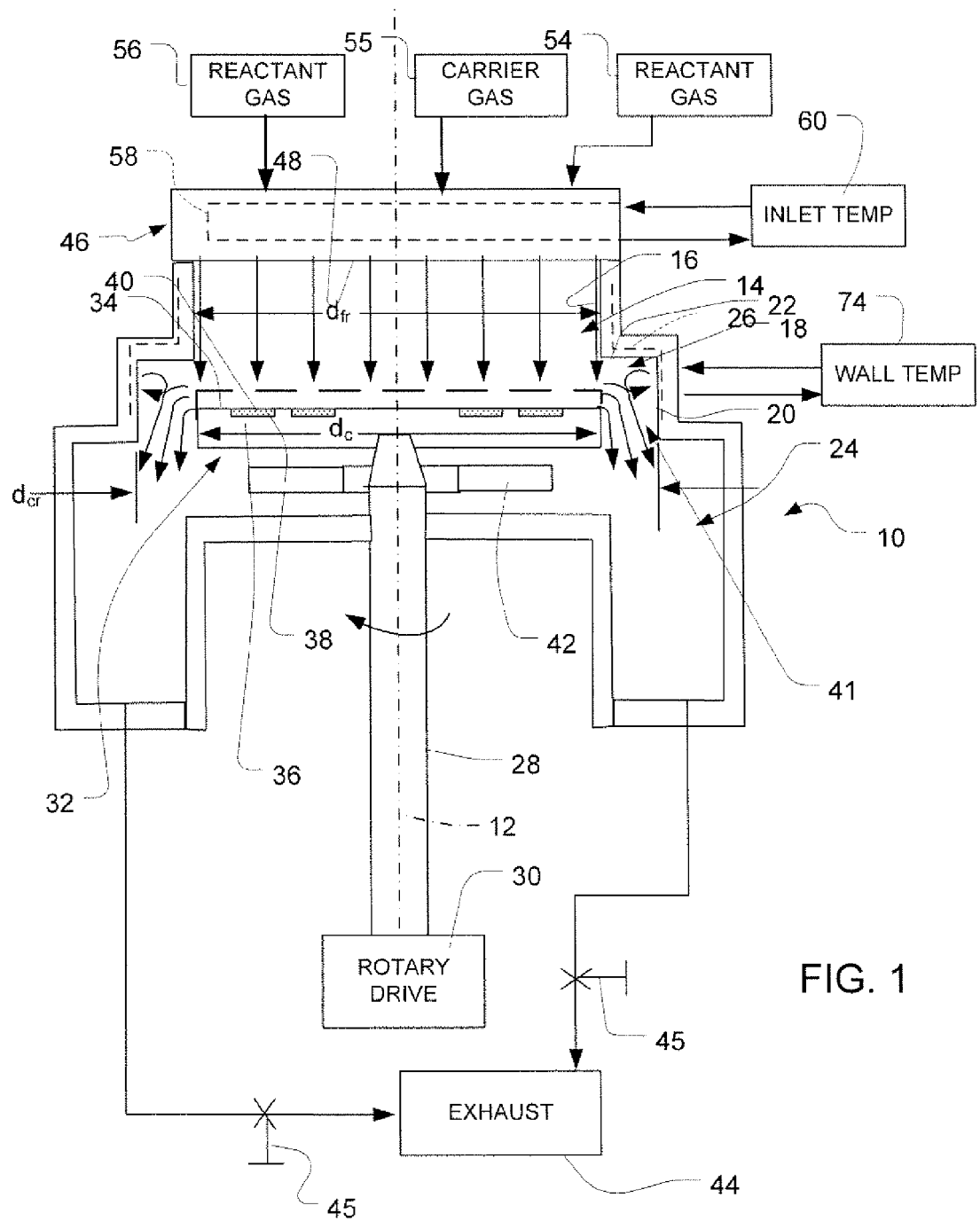
FIG. 1 is a diagrammatic view of a reactor according to one embodiment of the invention.

Apparatus according to one embodiment of the invention (FIG. 1) includes a reaction chamber 10 having a central axis 12. In this embodiment, axis 12 is substantially vertical as seen in the normal gravitational frame of reference. The interior walls of chamber 10 are generally in the form of surfaces of revolution about axis 12. In a flow region 14 at the top of the chamber, the interior wall 16 is substantially in the form of a cylinder having diameter $d_{FR}$ concentric with the axis. A region 18, referred to herein as the "carrier region," has a cylindrical interior wall 20 which is also generally in the form of a cylinder concentric with axis 12 and having diameter $d_{CR}$ larger than $d_{FR}$. The chamber has a downwardly-facing transition surface 22 at the juncture of the flow region and carrier region. The chamber also has an exit region 24 disposed below the carrier region. The chamber walls have passageways schematically indicated at 26 for passage of a temperature control fluid within the walls as discussed below.

Although the walls of the chamber are depicted as unitary elements in FIG. 1, in actual practice the walls may be formed from multiple elements. Also, the walls may include movable sections such as sections defining doors for transferring wafers into and out of the chamber. Merely by way of example, part or all of the interior wall in the carrier region may be defined by a ring-like shutter which is movable in the axial directions, as shown in U.S. Pat. No. 6,902,623, the disclosure of which is hereby incorporated by reference herein. Unless otherwise indicated, description of the chamber and other elements of the apparatus should be understood as referring to the configuration of the apparatus in an operative condition usable for depositing materials.

The apparatus has a wafer carrier drive mechanism, which includes a spindle 28 extending into chamber 10. The spindle is coaxial with axis 12 and rotatable about the axis. The wafer carrier drive mechanism also includes a rotary drive mechanism 30 such as an electric motor connected to the spindle. The apparatus also includes conventional elements such as bearings and vacuum-tight rotary seals (not shown).

A wafer carrier 30 is mounted on the spindle. The wafer carrier in this embodiment is a disc-like body formed from a refractory, inert material such as molybdenum, graphite or silicon carbide. The carrier has a generally planar top surface 34 and pockets 36 formed in the top surface. The pockets are arranged to hold a plurality of wafers 38 so that surfaces 40 of the wafers are exposed and are coplanar or nearly coplanar with the top surface 34 of the carrier. In the operative condition shown, the wafer carrier is engaged with spindle 28. The spindle supports the carrier within the carrier region 18 of the chamber with the top surface 34 and wafer surfaces facing upwardly, toward the top of the chamber, such surfaces being substantially perpendicular to axis 12. The diameter $d_C$ of carrier 32 is less than the diameter $d_{CR}$ of the carrier region 18, so that the periphery of the carrier and the inner wall 20 of the carrier region define a ring-like gap 41 surrounding the carrier and communicating with the exit region 24 of the chamber. For example, in a system with a wafer carrier of about 12.5 inches (31.75 cm) diameter $d_C$, $d_{CR}$ may be about 15.5 inches (39.4 cm). In this embodiment, the interior diameter $d_{FR}$ is approximately equal to the diameter $d_C$ of the wafer carrier or slightly larger than $d_C$. Typically, the wafer carrier is detachably mounted on the spindle, so that the apparatus can be reloaded by removing the wafer carrier from the spindle and replacing it with another carrier bearing new wafers.

A heater 42, as for example, a resistance heating element, is disposed within the reaction chamber for heating the substrate 32 carrier. An exhaust system 44 is connected to the exit region 24 of the chamber. The exhaust system is arranged to draw gasses from the interior of the chamber. The exhaust system desirably includes a controllable element such as a variable-speed pump or throttling valves 45 which can be adjusted to maintain a desired pressure within the chamber.

Figure 2:
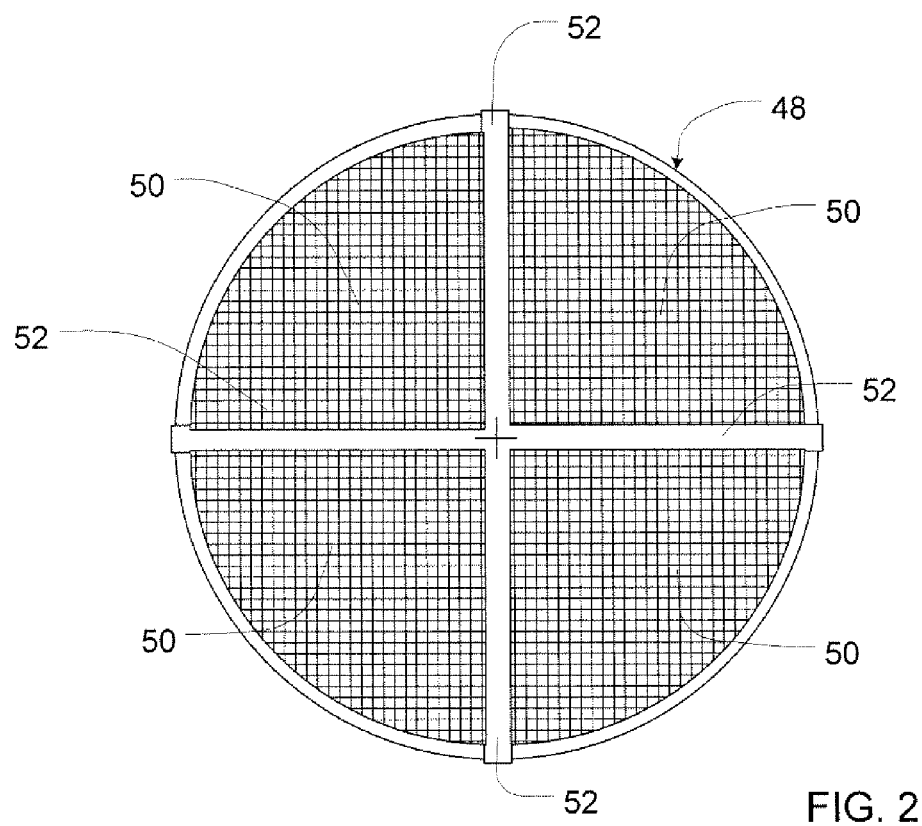
FIG. 2 is a diagrammatic sectional view depicting a component of the reactor shown in FIG. 1.

A flow inlet element 46 is mounted to the flow region 14 of the chamber and forms the top wall of the chamber. The flow inlet element is disposed above the carrier region 18 and above the wafer carrier 32. The flow inlet element is connected to sources 55 and 56 of the gases used in the process. The flow inlet element directs streams of the various gases into the reaction chamber and downwardly toward the wafer carrier and substrates. As further discussed below, the gas streams form a substantially laminar plug flow within flow region 14 of the chamber. Typically, the flow inlet element is arranged to discharge the gases over the entire cross-sectional area of the flow region. Stated another way, the cross-sectional area of the plug-like laminar flow, viewed in a horizontal plane perpendicular to axis 12, desirably has a diameter close to the interior diameter dF of the flow region. The diameter of the flow as seen in such cross-section desirably is approximately equal to or slightly greater than the diameter $d_C$ of carrier 32. Typically, the flow inlet element has openings distributed over its downwardly-facing bottom surface 48, these openings being connected to the gas sources. Merely by way of example, the flow inlet element may be arranged as shown in FIG. 2, with first inlets disposed in arrays distributed over regions such as quadrants 50 of the flow inlet bottom surface 48 and with second inlets distributed in radially-extending rows 52. The first inlets typically are connected to a source 54 (FIG. 1) of a Group V element such as a hydride, whereas the second inlets typically are connected to a source 56 (FIG. 1) of a Group III metal such as a metalorganic. These gas sources normally are arranged to provide the active reagents in admixture with a carrier gas such as N2 or H2 which does not participate in the deposition reaction. The flow inlet element also may have additional openings in its bottom surface for discharge of a carrier gas without active reagents, supplied by a separate source 55. For example, as disclosed in U.S. Published Patent Application No. 20060021574, the disclosure of which is hereby incorporated by reference, the carrier gas may be discharged between streams of Group V and Group III elements so as to suppress mixing of these streams and undesired reactions in the vicinity of the flow inlet element. Also, as disclosed for example in U.S. Published Patent Application No. 20070134419, the disclosure of which is also incorporated by reference herein, the flow rates and compositions of the various gas streams may be selected to provide similar gas density and flow rate in the various gas streams. Flow inlet element 46 has temperature control fluid passages indicated schematically at 58 for passage of a temperature control fluid.

The foregoing features of the apparatus may be similar to those used in the reactors sold under the registered trademark TURBODISC by Veeco Instruments, Inc. of Plainview, N.Y., USA.

Figure 3:
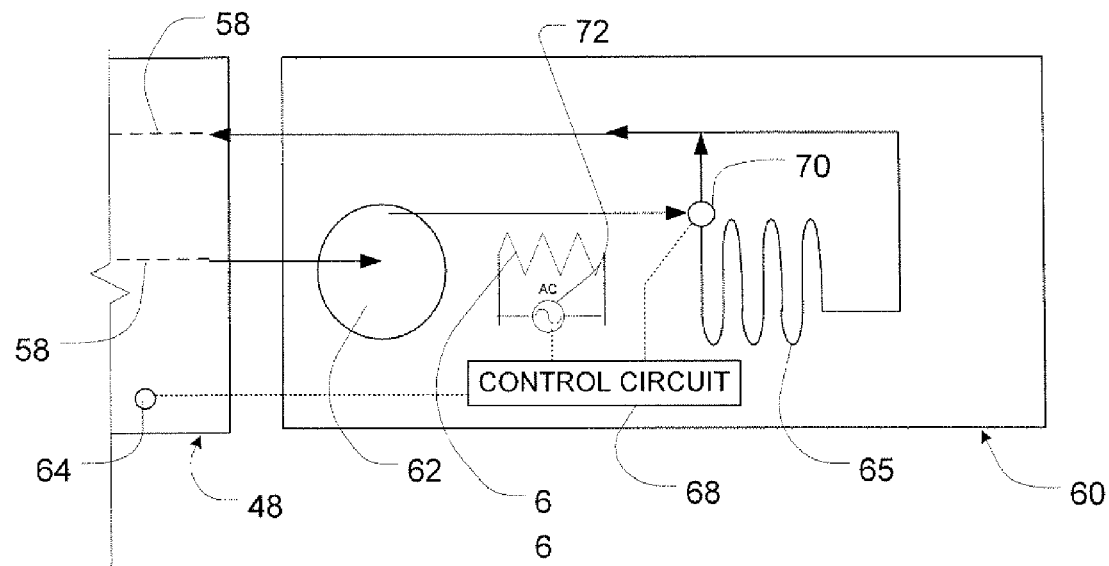
FIG. 3 is a schematic view of another component of the reactor shown in FIG. 1.

The temperature control fluid passages 58 of the flow inlet element 46 are connected to a flow inlet temperature control mechanism 60. One example of a control mechanism is depicted in FIG. 3. This control mechanism includes a pump 62 for circulating a fluid, most preferably a liquid such as water, ethylene glycol, a hydrocarbon oil or a synthetic organic heat transfer liquid such as those sold under the registered trademark DOWTHERM, through the temperature control fluid passages 58 of the fluid inlet element. The control mechanism also includes one or more sensors 64 for monitoring at least one temperature of the flow inlet element, the gases discharged from the flow inlet element, or the circulating fluid. The control mechanism desirably also includes a structure such as a radiator 65 arranged to dissipate heat from the circulating fluid into the environment, and also may include a heater such as an electrical resistance heater 66 or other element arranged to supply additional heat to the circulating fluid. The temperature control mechanism desirably further includes a control circuit 68 connected to the one or more sensors 64 and arranged to control operation of the heat-abstracting and heat-applying elements. In the particular embodiment depicted, the control circuit can vary the amount of heat abstracted from the fluid by controlling a bypass valve 70 to divert part or all of the circulating fluid away from the radiator, and can vary the amount of heat supplied to the fluid by controlling the operation of an electrical power supply 72 connected to the resistance heater. Many other arrangements of heat transfer elements can be employed, and these arrangements need not include a circulating fluid. For example, the flow inlet element can be provided with fins which dissipate heat directly into the atmosphere and with electrical heaters embedded in its structure. In such an arrangement, the temperature of the flow inlet element can be controlled by varying air flow over the fins, by controlling operation of the resistance heaters, or both. It is also possible to control the temperature of the flow inlet element and of the gases discharged from the flow inlet element by cooling or heating the gasses passing into the flow inlet element. Also, during operation, heat is transferred to the flow inlet element from the wafer carrier and wafers. Therefore, it is not essential for the flow inlet temperature control apparatus 60 to include a heat-supplying device such as resistance heater 66. The inlet temperature control apparatus 60 may be arranged to control the temperature of different zones of the flow inlet element separately. For example, the temperature control fluid passages 58 may include separate flow loops for different zone of the flow inlet element, and the temperature control apparatus may include separate subsystems associated with each such loop.

The flow inlet element 48 desirably is formed from metals or other materials having substantial thermal conductivity, and the gas passages (not shown) within the flow inlet element desirably are in intimate contact with the flowing fluid in passages 58, so that the temperature of the gases discharged from the flow inlet element and the temperature of the flow inlet element itself are close to the temperature of the heat transfer fluid. The flow inlet temperature control apparatus 60 is arranged to maintain the flow inlet element and the gases passing from the flow inlet element into the reaction chamber at an inlet temperature above about 75° C., about 75° C. to about 350° C., more desirably above about 100° C., such as, commonly about 100° C. to about 250° C., and most typically 100° C. to 250° C.

The apparatus also includes a wall temperature control apparatus 74 (FIG. 3). The wall temperature control apparatus may be connected to the temperature control fluid passages 26 in the walls of chamber 10, and may include elements similar to those of the inlet temperature control apparatus 60. The wall temperature control apparatus desirably is arranged to maintain the chamber walls in flow region 14, and desirably in the carrier region 18 as well, at a wall temperature within the ranges discussed above for the inlet temperature. Preferably, the wall temperature is close to the inlet temperature as, for example, within about 50° C., and more preferably within about 25° C., of the inlet temperature. The wall temperature control apparatus 74 may include multiple elements for separately controlling the temperature of individual zones of the chamber wall.

In a processing method according to one embodiment of the invention, the gas sources 54-56 are actuated to supply a flow of gases including the Group III and Group V elements, and typically also including a carrier gas, as a laminar, downward plug flow towards the wafer carrier 32 and wafers 38. The gas flow rate typically is about 25 to about 250 standard ml per minute per $cm^2$ of area cross-sectional area of the plug flow, as seen in a horizontal plane perpendicular to axis 12. Because the area of the plug flow as seen in such plane is close to the exposed area of the wafer carrier top surface 34 and wafer top surfaces 40, the gas flow rate computed on the basis of the carrier and wafer area typically is about the same, i.e., about 25 to about 250 standard ml per minute per $cm^2$ of area. For example, in a system with a wafer carrier of about 12.5 inches (31.75 cm) diameter, the flow rate is commonly about 50-300 standard liters per minute, i.e., about 60-400 standard ml/min per $cm^2$ of exposed surface area of the wafer carrier and wafer carrier. As used in this disclosure with reference to a gas, a "standard" liter or ml refers to a volume of gas at 25° C. (298° K) and 1 atm absolute pressure. The exhaust system 44 is controlled so as to maintain a desired pressure within the reaction chamber as, for example, above about 10 Torr, more preferably above about 100 Torr, and typically about 250 Torr to about 1000 Torr, most commonly about 250 Torr to about 750 Torr. The rotary drive 30 is actuated to turn the spindle 28 and hence wafer carrier 32 around the axis 12 at a desired rotation rate, typically above about 25 revolutions per minute, and more typically about 100 to about 1500 revolutions per minute. Heater 42 is actuated to maintain the wafer carrier and substrates at a desired substrate temperature, typically above about 400° C., more commonly about 700° C.-1100° C. The substrate temperature normally is selected to optimize the kinetics of the deposition reaction.

As the wafer carrier 18 is rotating rapidly, the surface of the wafer carrier and the surfaces of the wafers are moving rapidly. The rapid motion of the wafer carrier and wafers entrains the gases into rotational motion around axis 12, and radial flow away from axis 12, and causes the gases in the various streams to flow outwardly across the top surface 34 of the wafer carrier and across the exposed surfaces 40 of the wafers within a boundary layer schematically indicated at in FIG. 1. Of course, in actual practice, there is a gradual transition between the generally downstream flow regime denoted by the arrows in the flow region 14 and the flow in the boundary layer 76. However, the boundary layer can be regarded as the region in which the gases flow substantially parallel to the surfaces of the wafers. Under typical operating conditions, the thickness T of the boundary layer is about 1 cm or so. By contrast, the vertical distance from the downstream face of flow inlet element to the surfaces 40 of the wafers commonly is about 5-8 cm.

The rotational motion of the wafer carrier pumps the gases outwardly around the peripheral edges of the wafer carrier, and hence the gases pass over the edge of the wafer carrier and downwardly through the gap 41 between the wafer carrier and interior wall 20 of the carrier region. The gasses passing through the gap pass to exhaust system 44. A vortex 80 typically forms near the interior wall 20 and downwardly-facing wall 22. Provided that this vortex remains remote from the wafer carrier and wafers, it does not disrupt the smooth, uniform flow of gases over the wafer surfaces. In general, the vortex tends to increase with the rotational speed of the wafer carrier. If the rotational speed of the carrier is too low, however, recirculation occurs near the central axis 12. This recirculation is caused by convection; gases heated by the hot wafer carrier and wafers become less dense and tend to rise. Recirculation of this nature also will disrupt the smooth flow of gases over the wafer surfaces. Both of these problems tend to become more severe with increasing pressure within the reactor. The desired operating condition, referred to herein as "non-recirculating" operation, occurs when the vortex near interior wall 20 does not extend over the wafer carrier, and when recirculation near the central axis 12 does not occur.

Figure 4:
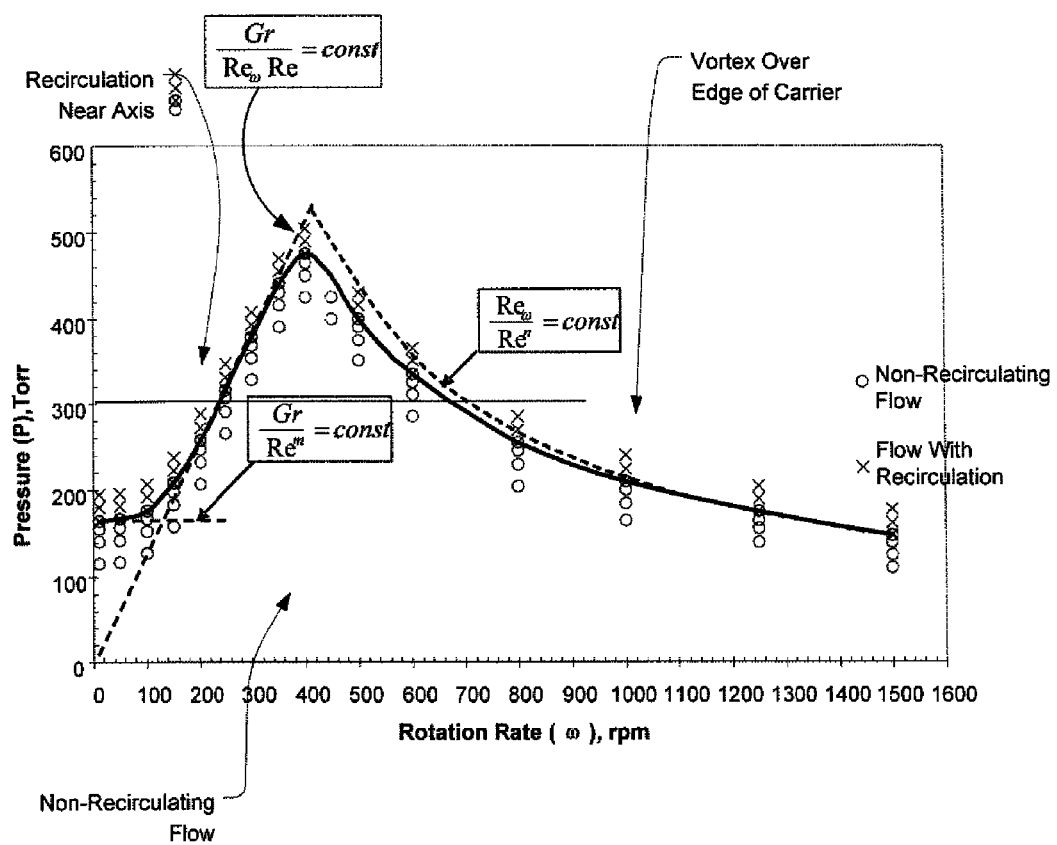
FIGS. 4 and 5 are graphs depicting certain operating conditions.

These effects are illustrated in FIG. 4. FIG. 4 represents results derived by computational flow dynamics for a particular reactor operating at a gas flow rate, gas composition, substrate temperature and gas inlet temperature, shown on a graph of pressure and rotation rate. Pressure and rotation rate below the solid-line curve in FIG. 4 represent non-recirculating operation, whereas pressure and rotation rate above the solid-line curve represent undesirable conditions. The minimum rotation rate which can be used at a given pressure is governed by convective recirculation. For example, at a pressure of 300 Torr, (solid horizontal line) minimum usable rotation rate is about 260 rpm; below that rate, there is recirculation near the axis due to convection. The maximum rotation rate which can be used at a given pressure is limited by the vortex at the edge of the wafer carrier. At 300 Torr, the maximum rotation rate is about 700 rpm. At higher pressures, the minimum rate increases and the maximum rate decreases, so that at pressure of about 480 Torr, the minimum and maximum rates are equal. This means that there is no rotation rate where this system, with the given gas flow rate, gas composition, substrate temperature and gas inlet temperature can operate in a non-recirculating regime at a pressure of about 480 Torr or above.

Although the present invention is not limited by any theory of operation, the shape of the curve in FIG. 4 can be understood by consideration of certain dimensionless numbers and ratios of the same. The Reynolds number Re defined by Formula 1 below provides a measure of the significance of forced convection.

$$Re = \frac{\rho_{mix} v_{mix} d}{\mu_{mix}} \quad \text{(Formula 1)}$$

The Rotational Reynolds number $Re_\omega$ defined by Formula 2 below provides a measure of the significance of forced convection due to the rotation of the wafer carrier.

$$Re_\omega = \frac{\rho_{mix} \omega d^2}{\mu_{mix}} \quad \text{(Formula 2)}$$

The Grashof number Gr defined by Formula 3 below provides a measure of the significance of natural convection.

$$Gr = \frac{g \rho_{mix}^2 H^3 \cdot (t_s - t_w)}{\mu_{mix}^2 t_w} \quad \text{(Formula 3)}$$

In each of Formulas 1-3:

$\rho_{mix}$, $\mu_{min}$, $v_{mix}$ represent density, viscosity and velocity of the gas mixture, respectively.

ω is the angular velocity of the wafer carrier.

d is the diameter of the wafer carrier.

H is the vertical distance between the flow inlet element and the wafer carrier top surface.

$t_s$ is the substrate temperature.

$t_w$ is the reactor wall temperature, which is assumed to be equal to the inlet temperature $t_i$.

Criteria for non-recirculating operation are defined by critical values of certain dimensionless ratios of Re, $Re_\omega$ and Gr, as indicated in Formula 4, below. These ratios represent the ratio of the relative strengths of different forces in the reactor.

$$\frac{Gr}{Re \cdot Re_\omega} \leq C_1; \ \frac{Gr}{Re^m} \leq C_2; \ \frac{Re_\omega}{Re^n} \leq C_3 \quad \text{(Formula 4)}$$

At very low rotational speeds, the effect of convection is counteracted only by the plug flow, and is substantially uninfluenced by rotation of the wafer carrier. Thus, as long as the inequality for constant $C_2$ is satisfied, recirculation near the axis due to convection does not occur. This is shown by the horizontal broken line in FIG. 4. At higher rotational speeds, the effect of rotation becomes significant, and operation without recirculation due to convection occurs if the inequality for constant $C_1$ is satisfied. This is indicated by the upwardlysloping broken line in FIG. 4. The vortex outboard of the wafer carrier is enhanced by higher rotation speed but suppressed by greater outward flow. Operation without the vortex spreading over the edge of the carrier occurs if the inequality for constant $C_3$ is satisfied, as indicated by the curving broken line in FIG. 4.

Figure 5:
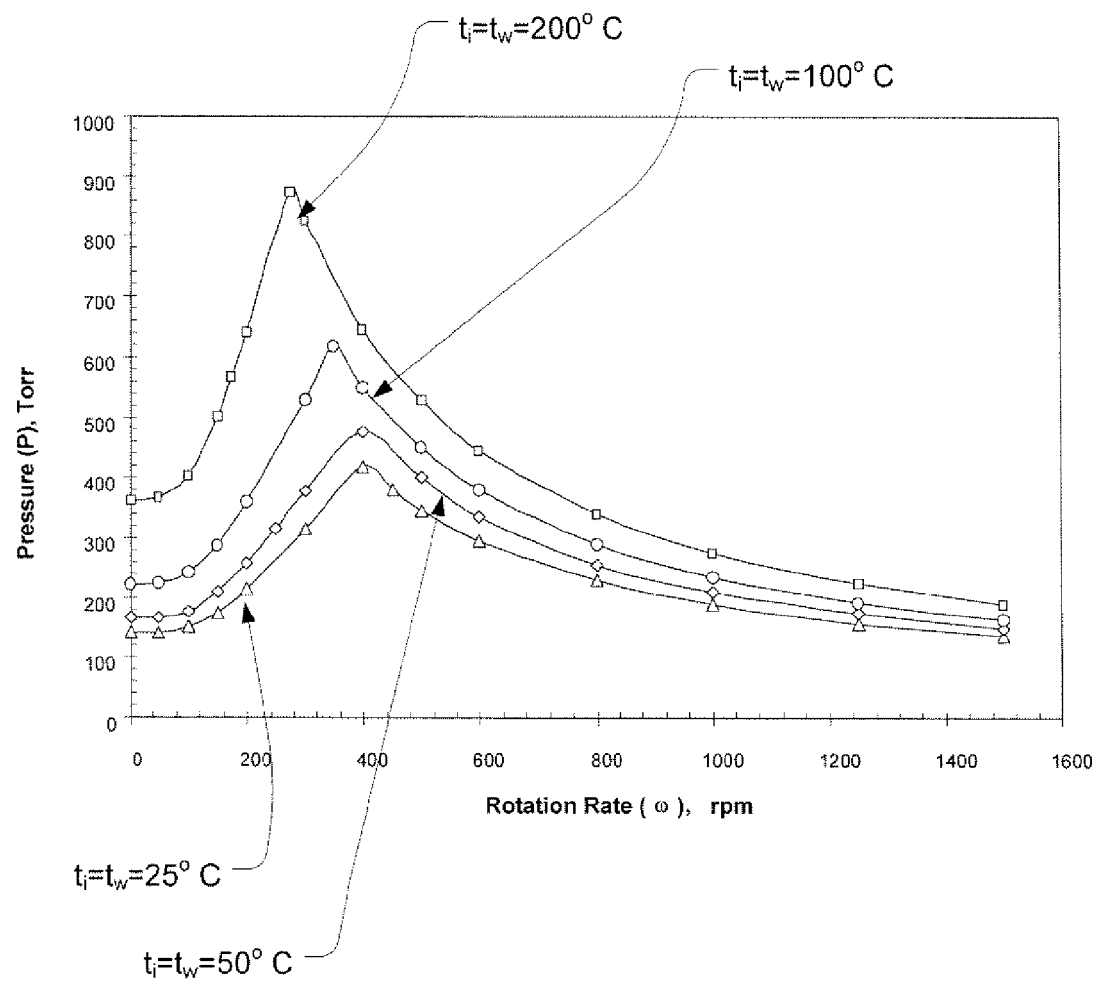

The effect of gas inlet temperature is shown in FIG. 5. Each curve in FIG. 5 is similar to the solid-line curve of FIG. 4. Here again gas flow rate, gas composition, and substrate temperature are fixed, and the different solid lines represent results computed for different gas inlet temperatures. For each curve, the gas inlet temperature ti and wall temperature tw are equal to one another. Raising the inlet temperature broadens the operating range in which non-recirculating conditions prevail. This effect is particularly pronounced at ti of above about 75° C., and particularly about 100° C. or higher. The curves for ti of 100° C. and 200° C. show non-recirculating operation at substantially higher pressures than the curves for ti of 25° C. and 50° C. Moreover, at operating pressures where non-recirculating operation can occur for ti of 25° C. or 50° C., the minimum rotational speed is substantially reduced at ti of 100° C. or 200° C. For example, at 400 Torr, a minimum rotational speed of almost 400 rpm is required to maintain non-recirculating operation at ti of 25° C., whereas the minimum rotational speed to maintain non-recirculating operation is only about 120 rpm for ti of 200° C. Thus, by increasing the inlet temperature, and desirably the wall temperature as well, the operating pressure can be increased, the rotational speed decreased, or both. Moreover, minimum flow rate for stable operation is directly related to rotational speed. As $t_i$ increases and rotational speed decreases, the required flow rate of gases through the reactor decreases substantially. These effects would continue for still higher $t_i$. However, with conventional reagents such as Group III metal alkyls and Group V hydrides, it is ordinarily desirable to maintain $t_i$ below about 250° C. to limit undesirable side reactions such as formation of solid deposits on the flow inlet element. Where these undesirable reactions can be suppressed in other ways, $t_i$ above 250° C. can be used.

In part, these effects can be understood qualitatively. Gasses expand with increasing temperature. Therefore, for a given gas composition and given flow rate (expressed in standard liters per minute), the volumetric flow rate (expressed in liters per minute) increases with inlet temperature. The higher volumetric flow rate in turn means that the velocity of the gas in the downward plug flow is greater. This tends to counteract the effect of convection. Also, the greater volumetric flow rate means that the speed of the gas moving radially outwardly, away from the axis, is also increased. This tends to keep the vortex away from the wafer carrier.

Numerous variations and combinations of the features discussed above can be employed. For example, the size of the reactor and the configuration of the reactor walls can be varied. Also, although the foregoing discussion refers to deposition of III-V semiconductors, the invention can be employed in chemical vapor deposition of other materials, particularly those which require a high substrate temperature for deposition and which conventionally employ low gas inlet temperatures and wall temperatures. Chemical vapor deposition apparatus and processes which employ a gas inlet temperature less than the substrate temperature, and a temperature difference ΔT of at least about 200° C. between these temperatures are referred to in this disclosure as "cold wall" apparatus and processes. Typically, ΔT in cold wall apparatus and processes is more than 200° C., as, for example, about 400° C. or more or about 500° C. or more. For example, cold wall apparatus and processes are commonly used in chemical vapor deposition systems in which one or more of the reactive gasses includes an organic or metalorganic compound. Certain cold wall deposition apparatus includes a rotating carrier. For example, cold wall systems of this type can be used to form silicon carbide from reactive gases including silane and a lower alkyl such as propane. Other examples include chemical vapor deposition of diamond, diamond-like carbon, nitrides other than the Group III nitride semiconductors discussed above, and other carbides. The invention can be applied to these systems as well.

The invention claimed is:

1. A method of chemical vapor deposition comprising:
  (a) supporting one or more substrates on a carrier within a reaction chamber so that surfaces of the substrates face upwardly within the chamber, while rotating the carrier about a vertical axis and maintaining the substrates at a substrate temperature of 400° C. or higher; and
  (b) directing gases including a Group III metal source and a Group V element source into the chamber from an inlet element disposed above the substrates so that the gases flow downward toward the substrates and outward away from the axis over the surfaces of the substrates and react to form a III-V compound on the substrate, the reactive gases being at an inlet temperature above about 75° C. when introduced into the chamber.

2. A method as claimed in claim 1 further comprising maintaining the walls of the chamber at a wall temperature between 75° C. and 350° C.

3. A method as claimed in claim 1 further comprising maintaining the walls of the chamber at a wall temperature within about 50° C. of the inlet temperature.

4. A method as claimed in claim 1 wherein the inlet temperature is from 75° C. to 350° C.

5. A method as claimed in claim 1 further comprising the step of maintaining the pressure within the chamber at about 10 Torr or higher.

6. A method as claimed in claim 5 wherein the pressure is about 100 Torr or higher.

7. A method as claimed in claim 6 wherein the pressure is about 200 Torr to about 750 Torr.

8. A method as claimed in claim 1 wherein the carrier is rotated at a rate of about 25 revolutions per minute or greater.

9. A method as claimed in claim 1 wherein the carrier is rotated at a rate of about 100 to about 1500 revolutions per minute.

10. A method as claimed in claim 1 wherein the step of directing gases is performed so that the gases flow in a laminar plug flow downwardly, parallel to the axis, from the inlet element.

11. A method as claimed in claim 10 wherein the laminar plug flow has a cross-sectional area in a horizontal plane approximately equal to or larger than an area of the carrier and substrates in a horizontal plane.

12. A method as claimed in claim 10 wherein the laminar plug flow provides about 25 to about 250 standard ml per minute per $cm^2$ of area of the carrier and substrates.

13. A method as claimed in claim 1 further comprising exhausting gases from the chamber below the carrier, so that gases passing outwardly away from the axis move generally downwardly between an outer edge of the carrier and the wall of the chamber.

14. A method as claimed in claim 1 wherein the Group III metal source includes one or more organic compounds of one or more Group III metals and the Group V element source includes one or more hydrides of one or more Group V elements.

15. A method as claimed in claim 1 wherein the Group III metal source includes a halide of a Group III metal.

16. A method as claimed in claim 1 wherein the gases include one or more carrier gases.

17. A method of chemical vapor deposition comprising:
   (a) supporting one or more substrates on a carrier within a reaction chamber so that surfaces of the substrates face upwardly within the chamber, while rotating the carrier about a vertical axis and maintaining the substrates at a substrate temperature; and
   (b) directing gases including reactive gases into the chamber from an inlet element disposed above the substrates so that the gases flow downward toward the substrates and outward away from the axis over the surfaces of the substrates and react to form a deposit on the substrates, the gases being at an inlet temperature when introduced into the chamber, the inlet temperature being less than the substrate temperature, such that there is a temperature difference of at least about 200° C. between the inlet temperature and the substrate temperature, and such that the inlet temperature is above about 75° C.

18. A method as claimed in claim 17 wherein the temperature difference is at least about 400° C.

19. A method as claimed in claim 17 wherein the gases include one or more compounds selected from the group consisting of organic and metalorganic compounds.

20. A method as claimed in claim 17 further comprising maintaining the walls of the chamber at a wall temperature within about 50° C. of the inlet temperature.

* * * * *